United States Patent [19]

Ellis et al.

[11] 4,427,638

[45] Jan. 24, 1984

[54] APPARATUS FOR SEMICONDUCTOR RIBBON-TO-RIBBON CONVERSION

[75] Inventors: Ralph J. Ellis; Richard W. Gurtler, both of Mesa; Kalluri R. Sarma, Tempe, all of Ariz.

[73] Assignee: Motorola, Inc., Schaumburg, Ill.

[21] Appl. No.: 301,627

[22] Filed: Sep. 14, 1981

[51] Int. Cl.³ ................... C30B 13/06; C30B 13/32
[52] U.S. Cl. ........................ 422/250; 156/DIG. 98
[58] Field of Search ............. 422/254, 250; 156/620, 156/DIG. 88, DIG. 102, DIG. 80, DIG. 73, DIG. 64, DIG. 98

[56] References Cited

U.S. PATENT DOCUMENTS

| 4,199,397 | 4/1980 | Gurtler | 156/DIG. 88 |
| 4,325,777 | 4/1982 | Yarwood et al. | 156/620 |

FOREIGN PATENT DOCUMENTS 2649223  5/1978  Fed. Rep. of Germany ... 156/DIG. 102

OTHER PUBLICATIONS

Soviet Physics–Solid State, vol. 8, No. 2, 2/66, Tsivinskii et al.

*Primary Examiner*—Hiram H. Bernstein
*Attorney, Agent, or Firm*—John A. Fisher

[57] ABSTRACT

Apparatus is provided for semiconductor ribbon-to-ribbon conversion in a rigid edge mode. A combination carrier and mask is provided by which the ribbon is secured during the conversion process. The carrier holds the ribbon and simultaneously masks the edges of the ribbon from the heating effects of an impinging energy beam. The energy beam, such as a laser or electron beam, impinges on the ribbon and creates a molten zone which extends through the thickness of the ribbon. During the growth process, the molten zone is caused to move along the length of the ribbon. The mask prevents melting of the extreme edge portions of the ribbon and thus allows a rapid growth rate and a stable molten zone without sophisticated electronic equipment to gate the energy beam at the ribbon edges.

2 Claims, 7 Drawing Figures

APPARATUS FOR SEMICONDUCTOR RIBBON-TO-RIBBON CONVERSION

BACKGROUND OF THE INVENTION

This invention relates in general to an apparatus for a semiconductor ribbon-to-ribbon conversion process and, more specifically, to an apparatus for a rigid edge mode semiconductor ribbon-to-ribbon conversion process.

In the manufacture of semiconductor devices such as transistors, integrated circuits, photovoltaic devices, and the like, the semiconductor industry uses large quantities of semiconductor material, usually silicon, in the form of thin wafers or sheets. It has been conventional to produce the semiconductor wafers by first growing a single crystal semiconductor ingot, sawing the ingot into a plurality of thin slices, and then lapping and polishing the slices to the desired thickness and surface finish. While this process has proved satisfactory for most semiconductor devices, it is too expensive for some large area semiconductor devices and especially for large area photovoltaic devices or solar cells. In fact, in order that photovoltaic devices become a viable alternative energy source, a significant reduction in the cost of the semiconductor starting material is essential.

One technique which has been proposed and developed for the production of thin sheets of semiconductor material suitable for the production of solar cells is the so-called ribbon-to-ribbon (RTR) growth process. In this process, a polycrystalline ribbon is transformed directly into a macrocrystalline ribbon without the need for the costly processing of large diameter ingots. The RTR process uses one or more scanned beams of energy impinging on a polycrystalline ribbon to locally melt the ribbon and to induce crystal growth as the ribbon is translated past the energy beam. As the molten zone moves along the ribbon, the material behind the zone resolidifies in a macrocrystalline form. The macrocrystalline structure is one in which the crystals are of sufficiently large size to permit efficient semiconductor action. Therefore, a monocrystalline ribbon wherein the ribbon is but a single crystal is encompassed within the term "macrocrystalline". In this context, the word "ribbon" generally implies a long strip or sheet having a width much greater than its thickness. Typical dimensions might be a length of up to several meters, a width of 10-100 millimeters and a thickness of 50-250 micrometers.

There are a number of difficulties, however, which are incumbent upon the ribbon-to-ribbon conversion process. To control and stabilize the melt, for example, it is necessary that the molten zone be of limited extent and not extend to the edge of the ribbon. Thus the process is typically carried out in the rigid edge mode wherein edge portions of the ribbon are not melted but are instead left intact. By maintaining a rigid edge the molten zone is always bounded; without the rigid edge the molten zone, under the influence of surface tension, tends to "neck in" making it extremely difficult to maintain the desired width of the macrocrystalline ribbon. In the extreme, the molten zone may collapse, terminating growth. As heretofore practiced, the rigid edge mode is achieved by limiting the scan of the beams to the interior regions of the ribbon, or by gating the impinging energy beam using sophisticated electronic equipment. These techniques are complicated and limit the flexibility of the process, especially when multiple ribbons are grown simultaneously.

A further difficulty results from non-uniformity in thickness or from breaks in the polycrystalline source material. Such non-uniformities result in loss of control of the molten zone and can further result in the separation of the polycrystalline and macrocrystalline ribbon segments. The possibility of the segments separating requires polycrystalline and macrocrystalline materials be independently supported even though such support would not be required in the ideal rigid edge mode process.

The kinetics of the growth process lead to a preference for a molten zone having a particular shape. One such shape, for example, referred to as the "dogbone" melt zone shape because of the enlarged end portions of the molten zone, provides for growth vectors at the freezing boundary to be directed away from the ribbon edge. The desired shape can be achieved through further control and gating of the energy source, but such shaping adds to the difficulties of controlling the beam in the rigid edge mode.

A further difficulty results simply from the fragile nature of the ribbon being transformed. The fragile ribbon is susceptible to breakage and requires careful handling. Such requirement adds to the complexity of the mechanical system required for translating the ribbon past the energy source.

Accordingly, a need existed to develop an improved apparatus which would overcome the above mentioned and other problems of prior art apparatus to provide an efficient, low cost semiconductor ribbon.

It is an object of this invention to provide an improved apparatus for converting polycrystalline material to macrocrystalline material.

It is another object of this invention to provide an improved carrier for the conversion of polycrystalline ribbon to macrocrystalline ribbon.

It is yet another object of this invention to provide a combined carrier and mask for the rigid edge RTR process.

SUMMARY OF THE INVENTION

The foregoing and other objects are achieved in the present invention through the use of a ribbon carrier which also serves to mask the edges of the ribbon from the impinging energy beam. Polycrystalline ribbon is supported at its perimeter by a carrier constructed from non-contaminating material. The carrier is constructed to shadow the edges of the ribbon from the impinging energy beam. The energy beam is programmed to produce the desired melt shape without regard to maintaining a rigid edge.

DETAILED DESCRIPTION OF THE PREFERRED EMBODIMENTS

Figure 1:
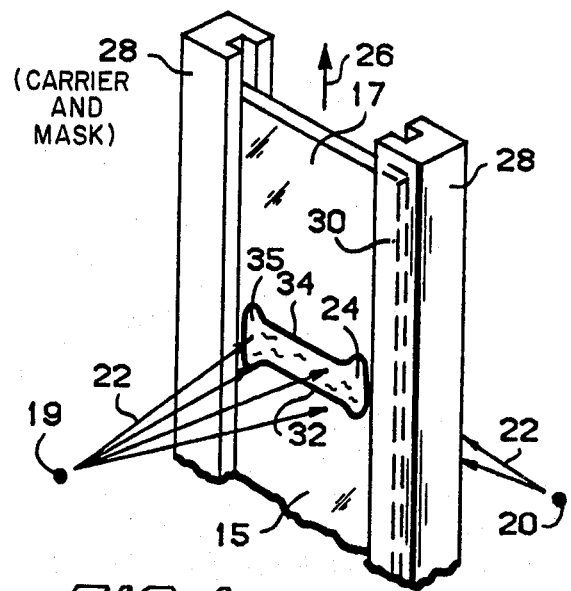
FIG. 1 illustrates the rigid edge mode RTR process.

FIG. 1 illustrates a first embodiment of the invention in which a polycrystalline ribbon 15 is converted to a macrocrystalline ribbon 17. The ribbons can be of silicon or other semiconductor material. Two energy sources 19 and 20 provide energy which impinges on the front and rear surfaces of the ribbon as indicated by the lines 22. Two energy sources are shown in this embodiment; in other embodiments, only a single energy source is used. The energy sources are preferably either lasers or electron beam sources. The energy sources are controllable and impinging energy 22 scans across the surface of the ribbon to form a molten zone 24 which extends through the thickness of the material.

The ribbon is held at its edges, in accordance with the invention, by a combination carrier and mask 28. The carrier holds the polycrystalline and macrocrystalline ribbon at its periphery and masks the edge portion 30 of the ribbon from the impinging energy 22. By so masking, the combination mask and carrier prevents the extension of the molten zone 24 to the edges of the ribbon. The edges of the ribbon are thus protected from and not melted by the energy from sources 19 and 20; the molten zone is bounded by solid material including the polycrystalline ribbon 15, macrocrystalline ribbon 17 and unmelted edges 30.

As the process proceeds, the carrier and ribbon are moved past the energy sources preferably in the direction indicated by arrow 26 although satisfactory conversion is achieved by motion in either direction. The relative motion between the ribbon and the energy sources causes the molten zone to be swept along the ribbon. As the molten zone passes along the ribbon, polycrysalline material is melted along edge 32 of the molten zone; edge 34 of the molten zone represents a freezing boundary along which the molten material resolidifies as macrocrystalline material having an enhanced grain size.

A number of additional advantages are realized by the use of carrier 28. One advantage is that molten zone 24 can be easily adjusted to a desired melt shape configuration. Enlarged end portions 35, such as the "dogbone" shape illustrated, encourage enhanced grain growth as the molten zone refreezes. Normal scanning techniques, and especially those associated with prior art edge control techniques, often cause melt shape configurations that produce undesirable growth directions and dislocations and impede growth of large crystallites. In accordance with the invention, however, the mask 28 aids in the formation of a preferred melt shape during growth because of the additional heat transfer directed toward the edge of the ribbon by the thermal mass of the mask. The enlarged ends of the molten zone can be formed, for example, by over powering the energy sources at the ends of the beam scan as the scan reaches the intersection between ribbon and mask. In the absence of a mask, overpowering at the ends of the scan is difficult to control without melting through the rigid edge of the ribbon.

In the prior art process, at high growth velocities, there is a tendency for thermal stress induced buckling of the ribbon to occur. A further advantage resulting from the practice of this invention is that buckling is greatly inhibited. The use of the ribbon carrier inhibits large amplitude buckling by holding and supporting the ribbon, maintaining the edges in a plane as the ribbon is transformed from solid to liquid and back to solid.

An additional advantage resulting from the invention is that the delicate ribbon, once inserted in a carrier, becomes much easier to handle. Further processing of the ribbon can be achieved, for example, without demounting the ribbon from the carrier, thus minimizing the handling of the ribbon itself. Besides reducing the possibility of damage to the ribbon from repeated handling, processing the ribbon in its carrier helps to maximize processing throughput. Individual ribbons may be of somewhat irregular shape, and thus difficult to handle automatically. Once mounted in a uniformly sized carrier, however, the ribbon is capable of automated handling including "cassette-type" loading and unloading in the conversion process as well as in both prior and subsequent processing.

Figure 2:
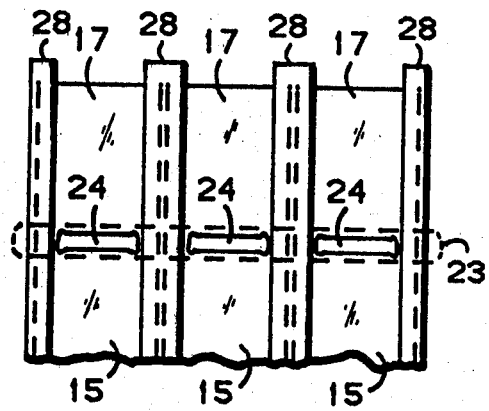
FIG. 2 illustrates a multiribbon RTR process.

FIG. 2 illustrates a further embodiment of the invention which increases the throughput of the ribbon-to-ribbon conversion process. In this embodiment a number of polycrystalline ribbons 15 are held in parallel by a multiple carrier 28. An energy beam scans across the plurality of ribbons in the pattern indicated by the numeral 23 forming a melt region 24 in each of the ribbons. As the melt regions are moved along the polycrystalline ribbons, a plurality of macrocrystalline ribbons 17 are formed. The plurality of ribbons can be processed without gating the energy beam at the edge of each ribbon. The energy beam is swept across the carrier and plurality of ribbons, forming a molten zone in each ribbon. The carrier masks the beam at the edge of each ribbon to maintain rigid edges on each ribbon. The carriers are substantially unaffected by the sweeping energy beam.

Figure 3:
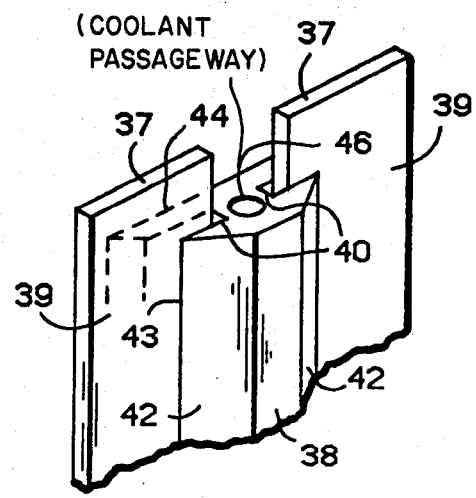
FIGS. 3-6 illustrate in cross-section embodiments of the combination carrier and mask.

FIGS. 3-6 illustrate a number of possible alternate cross-sectional configurations for the carrier. FIG. 3, for example, illustrates one embodiment of a combination carrier and mask 38 for use in multiple ribbon processing. Carrier 38 is adapted for a process utilizing a single energy source impinging upon a single surface 39 of the ribbons 37. The carrier includes channel-shaped recess 40 into which the ribbon edge is placed. The front of the combination carrier and mask then has sides 42 which extend over the mask from the impinging energy beam the edges of the ribbon. The beveled portion of edge 42 terminating in the sharp line 43 is a preferred embodiment as it aids in achieving a sharp, well defined edge for the regrown portion of the macrocrystalline ribbon. The back portion 44 of carrier 38 provides only a support function in this embodiment; it is not used for masking. The mask and carrier may be provided with a passageway 46 through which a coolant is passed to maintain the carrier at an acceptably low temperature during the regrowth process. In multi-ribbon processing, a plurality of carriers 38 are joined in parallel as illustrated in FIG. 2.

Figure 4:
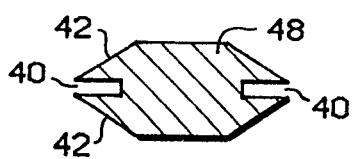

FIG. 4 illustrates in cross-section a similar mask and carrier 48 which is, however, adapted for converting ribbons in a process which utilizes energy beams impinging upon the ribbons from both the front and the back. This embodiment includes recesses 40 for securing the edges of the ribbon during processing. The edges 42 of both the front and the back of the mask are adapted to provide the required masking function. Again, the edges 42 are illustrated in a preferred embodiment having sharp bevelled edges. Again, although not shown in this Figure, the carrier can be provided with a passageway for coolant.

Figure 5:
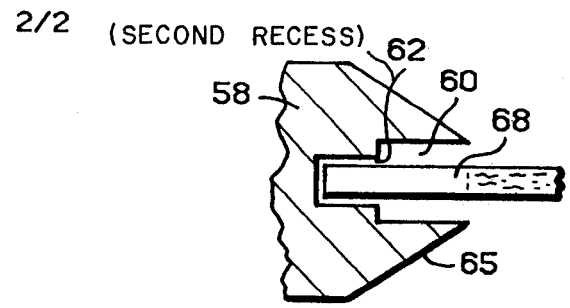

The carrier acts as a heat sink at the edge of the ribbon and the carrier's thermal mass is generally sufficient to limit the lateral extent of the molten zone and thereby to prevent sticking of the ribbon to the mask. FIG. 5 illustrates a further embodiment of a combination carrier and mask 58 in accordance with the invention which further insures that such sticking is prevented. As shown in the partial cross-section, the mask includes a first channel shaped recess 60 with a second channel shaped recess 62 located within the first channel shaped recess. The first and second channel shaped recesses serve to secure the ribbon 64 and to insure that the molten portion of the ribbon does not contact the mask. Masking edge 65 limits the contact of the energy beam to the unmasked portion of the ribbon. The edge of the ribbon 68 is not melted by the energy beam; sticking between the ribbon and the carrier is thus avoided since no liquid material contacts the carrier.

Figure 6:
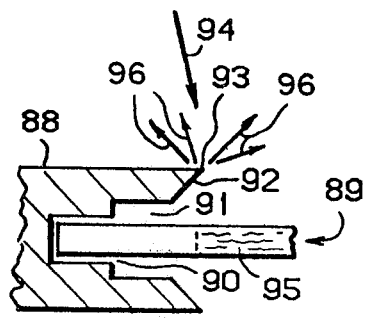

A still further variation, especially useful when the source of energy used is an electron beam, is illustrated by the carrier and mask 88 in the partial cross-section shown in FIG. 6. Ribbon 89 fits into a recess 90 within recess 91. The edge of recess 91 is bounded by a beveled edge 92 which culminates in the well-defined edge 93. The edge of ribbon 89 is masked from the impinging electron beam 94 by edge 93 to provide a sharply defined molten region 95. A carrier having the illustrated cross-section is useful when the electron beam energies used are sufficiently high to cause significant evaporation or sputtering of the carrier material. Carrier 88 is configured so that nearly all material trajectories, illustrated by the arrows 96, are away from the ribbon. The purity of the recrystallized material can otherwise be adversely affected by the sputtered/evaporated material. The carrier thus provides support and masking as well as avoiding contact between the molten zone and the mask and between sputtered carrier material and the ribbon.

Figure 7:
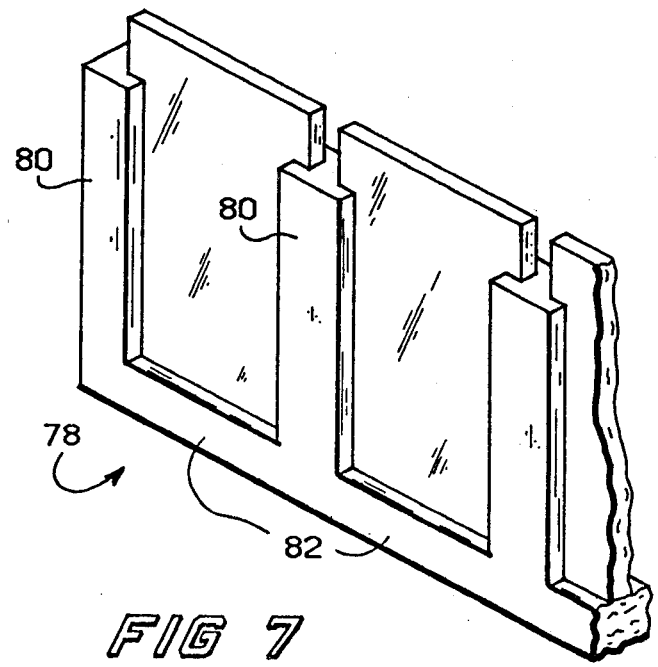
FIG. 7 illustrates one embodiment of ribbon carrier and mask.

FIG. 7 illustrates one way in which the silicon ribbon can be secured within the carrier 78. The carrier is essentially U-shaped with side portions 80 limiting the lateral motion of the ribbon and providing the masking function. The bottom 82 of the carrier can be either solid or channel-shaped like the edge portions. The ribbon rests upon and is supported by bottom 82. This configuration of carrier accommodates ribbons of slightly varying widths and thicknesses and does not require rigid, physical clamping of the ribbon in the recesses of the side portions.

Using a carrier such as that illustrated in FIG. 7, the carrier together with the ribbon are translated past the energy source to cause the molten zone to move along the ribbon. Alternatively, the carrier can be fixed in position with respect to the energy source and the ribbon moved with respect to the combination carrier and mask. In this alternative the carrier functions merely as a guide and mask through which the ribbon moves as it is being converted.

The combination carrier and mask can be fabricated of a refractory material such as graphite, quartz, alumina, or the like. The carrier can further be fabricated from silicon, with or without a coating such as silicon nitride or silicon dioxide to minimize sticking. The carrier is fabricated to have a sufficiently greater thermal mass than does the semiconductor ribbon so that the carrier is relatively unaffected by the impinging energy beam although the energy beam is sufficient to melt the thinner semiconductor material. If the energy beam is an electron beam, it is preferable that the carrier be conductive (e.g. graphite) to provide a leakage path for the impinging electron beam. Alternatively, electrical contact to the ribbon must be provided which provides the necessary leakage path to ground.

Thus it is apparent that there has been provided, in accordance with the invention, an improved apparatus for the ribbon-to-ribbon conversion of semiconductor material in the rigid edge mode which fully meets the objects and advantages set forth above. The mask prevents melting of the extreme edge portions of the ribbon and thus allows a rapid growth rate and a stable molten zone without sophisticated electronic equipment to gate the energy beam at the ribbon edges. While the invention has been described with respect to certain embodiments thereof, it is not intended that the invention be limited by these illustrative embodiments. Alternate materials other than silicon, for example, can be processed in accordance with the invention. Further variations and modifications including, for example, other configurations of the carrier and mask will, of course, be apparent to those skilled in the art in light of the foregoing description. Accordingly, it is intended to embrace all such variations and modifications as fall within the scope of the invention.

We claim:

1. An apparatus for use in converting polycrystalline ribbon having two major surfaces terminating at edges thereof to macrocrystalline ribbon wherein a molten zone is formed in said polycrystalline ribbon by an impinging energy beam and said molten zone is moved along said ribbon, said apparatus comprising: carrier means comprising a first channel shaped recess into which the edge of said ribbon can be placed for supporting said ribbon; and masking means integral with said carrier means protecting portions of said ribbon adjacent said edges from said impinging energy beam, said masking means comprising a portion of said carrier means overlapping one of said surfaces.

2. The apparatus of claim 1 further comprising a second channel shaped recess within said first channel shaped recess.

* * * * *